(12) United States Patent
Hatada et al.

(10) Patent No.: US 6,428,848 B1
(45) Date of Patent: *Aug. 6, 2002

(54) METHOD FOR PRODUCING A METAL EVAPORATED ARTICLE

(75) Inventors: Kenji Hatada; Manichi Yuuki, both of Shiga; Norio Tanaka, Shizouka; Masanori Ueda; Toshio Yasuda, both of Shiga, all of (JP)

(73) Assignee: Toray Industries, Inc. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/130,296

(22) Filed: Aug. 6, 1998

(51) Int. Cl.[7] ............................................. C23C 16/06
(52) U.S. Cl. ...................................... 427/251; 427/8
(58) Field of Search ................. 427/131, 132, 427/250, 251, 255.6, 255.7, 8

(56) References Cited

U.S. PATENT DOCUMENTS

| | | | |
|---|---|---|---|
| 3,637,421 A | * 1/1972 | Gimigliano | 427/250 |
| 3,753,369 A | * 8/1973 | Fowler et al. | 73/15.4 |
| 4,112,137 A | * 9/1978 | Zega | 427/561 |
| 4,268,541 A | * 5/1981 | Ikeda et al. | 427/177 |
| 4,287,224 A | * 9/1981 | Heimbach et al. | 427/255.37 |
| 4,683,143 A | 7/1987 | Riley | |
| 4,840,844 A | * 6/1989 | Futamoto et al. | 428/336 |
| 4,888,211 A | * 12/1989 | Oka et al. | 427/130 |
| 5,427,869 A | * 6/1995 | Sugita et al. | 428/694 T |
| 5,803,976 A | * 9/1998 | Baxter et al. | 118/726 |
| 5,855,956 A | * 1/1999 | Xu et al. | 427/255.32 |

* cited by examiner

Primary Examiner—Bret Chen
(74) Attorney, Agent, or Firm—Schnader Harrison Segal & Lewis LLP

(57) ABSTRACT

A process for producing a metal evaporated article, which includes a metallization step of evaporating a metal and depositing the evaporated metal onto a continuously running substrate and an auxiliary material deposition step of evaporating an auxiliary material contained in an evaporator and depositing the evaporated auxiliary material onto the continuously running substrate, before or after the metallization step, comprising the steps of detecting the pressure of the atmosphere where the auxiliary material evaporated from the evaporator exists, and controlling the evaporation condition of the auxiliary material in the evaporator based on the information concerning the detected pressure.

10 Claims, 1 Drawing Sheet

METHOD FOR PRODUCING A METAL EVAPORATED ARTICLE

FIELD OF THE INVENTION

The present invention relates to method and apparatus for producing a metal evaporated article.

In the production of a metal evaporated article, it is practiced to deposit an auxiliary material, such as margin forming oil, corrosion preventive oil or surface modifying material, by evaporation at predetermined portions on the surface of a substrate itself or the surface of a metal deposited on the substrate before or after metallizing the substrate.

The present invention particularly relates to method and apparatus for producing a metal evaporated article improved in the vapor deposition of an auxiliary material.

DESCRIPTION OF THE PRIOR ART

As a typical metallized film with a desired metal deposited on the surface of a film (substrate) made of a synthetic resin, etc., a metallized film for a capacitor is known. It is generally produced by a vacuum metallizer.

In this case, to form portions (margins) where any metal is not deposited on the substrate, it is practiced to deposit an oil by evaporation at the predetermined portions on the surface of the substrate before metallization.

Japanese Patent Publication (Tokko) 8-26449 discloses a method for forming margins by depositing a narrow thin oil layer by evaporation on the surface of a raw film for production of a metallized film for a capacitor.

Japanese Patent Laid-Open (Kokai) No. 59-227115 and Japanese Patent Publication (Tokko) No. 63-15735 propose methods for depositing an oil by evaporation on the surface of a metal layer formed on the surface of a substrate for preventing the corrosion of the metallized film.

These methods are excellent for the purpose of forming margins or forming a corrosion preventive layer.

A case of forming margins will be described hereunder. Since, generally, an oil using for it has dispersed molecular weight, it is intended to use an oil having narrow molecular weight distribution.

However, even if an expensive oil having narrow molecular weight distribution is used, the oil is somewhat different in molecular weight distribution between production lots. So, if an oil produced in a plurality of lots is used to form margins, it may happen that the formed margins become different in the state.

The reason is that where the oils are different in molecular weight distribution, the vapor pressures of the oils are different, and that even where the oil temperature is set at the same degree in respective evaporation batches, the quantity of the oil evaporated becomes different.

Furthermore, where an oil irregular in molecular oil distribution is kept evaporated at a predetermined oil temperature for a certain period of time, the oil components lower in molecular weight are evaporated at first, and it happens that the components evaporated at a predetermined temperature decrease remarkably even though there still remains much oil in the evaporator.

To avoid this problem, that is, to continuously form a thin oil layer with a certain thickness, it is necessary to always give a constant quantity of evaporated oil to the surface of the substrate.

To solve this problem, the operator gradually raises the oil temperature after depositing every thousands of meters, to keep the quantity of evaporated oil as constant as possible.

However, this temperature control relies on sensibility of the operator acquired on his or her experience for many years, and in addition, it cannot be confirmed during vapor deposition how much oil has been evaporated and how much oil has been deposited on the film by raising the temperature of oil. So, it is difficult to continuously keep the optimum quantity of oil over a batch film metallization length of tens of thousands of meters. As a result, in one metallization batch, the oil layer thickness varies and the margin formation also varies.

Furthermore, since the oil temperature must be raised manually frequently, operation errors are likely to be committed in margin formation.

Moreover, to form an oil layer with an optimum thickness on the film, the quantity of evaporated oil must be changed in response to the change of the running speed of the film to be treated, but the operator cannot respond to the change, and only raises the temperature of the oil constantly in evaporation operation even if the film speed varies.

If the quantity of oil in the thin oil layer deviates from the optimum value and becomes too small for the above reasons, the metal remains in the margin portions in the final product, to cause a metallization loss.

For the same reasons, also the prevention of corrosion of the deposited metal becomes functionally insufficient. On the other hand, if the quantity is too large, when the metallized film is used to form a capacitor element, press workability declines, to degrade the adhesion between films in the obtained capacitor. If a voltage is applied to the capacitor, the capacitor beats inconveniently.

Even when the auxiliary material is an organic compound or water, the deposited layer thickness cannot be measured during vapor deposition, and so it is difficult to deposit the layer continuously with the optimum thickness.

SUMMARY OF THE INVENTION

The object of the present invention is to overcome the above conventional problems by providing a process and apparatus for producing a metal evaporated article, which allow the stable formation of a layer of a deposited auxiliary material on a substrate.

The process and apparatus for producing a metal evaporated article of the present invention to achieve the above object are as follows.

A method for producing a metal evaporated article, which includes a metallization step of evaporating a metal and depositing the evaporated metal onto a continuously running substrate and an auxiliary material deposition step of evaporating an auxiliary material contained in an evaporator and depositing the evaporated auxiliary material onto the continuously running substrate, before or after the metallization step, comprising the steps of detecting the pressure of the atmosphere where the auxiliary material evaporated from the evaporator exists, and controlling the evaporation condition of the auxiliary material in the evaporator based on the information concerning the detected pressure.

In the method, the form of the substrate may be generally a continuous long sheet or film, or may also be short sheets or films, etc. having a predetermined length.

The material of the substrate is generally a natural, semi-synthetic or synthetic resin. Preferable synthetic resins which can be used here include polyolefin resins, polyester resins, polyimide resins, polyamidimide resins, polycarbonate resins, polysulfone resins, polyphenylene resins, polyallylate resins, fluorine resin and polystyrene resin.

When the metal evaporated article is a metallized film for a capacitor, the synthetic resins which can be preferably used in view of mechanical properties and electric properties include polypropylene, polyethylene terephthalate, polyethylene naphthalate, polyphenylene naphthalate, polyphenylene sulfide, polycarbonate and polystyrene resin. Above all, polypropylene and polyethylene terephthalate resins can be especially preferably used since they are high in AC withstand voltage.

Conductive metals which can be deposited by evaporation include Al, Zn, Cu, Ag, Au, Sn, Ti, Co, Ni and their alloys. When the metal evaporated article is a metallized film for a capacitor, the conductive materials which can be preferably used among them in view of corona deterioration resistance are Al, Zn, Cu, Sn and their alloys. Among them, Al—Zn alloy is more preferable in view of moisture resistance, corona deterioration resistance and self recoverability.

In the method, the conventional work to adjust the evaporation condition of the auxiliary material in the evaporator in the auxiliary material evaporation step in reference to sensibility of the operator based on his or her experience is not substantially required, and the problem of fluctuation in the thickness of the deposited auxiliary material layer in the products obtained in one batch can be substantially solved.

In the production of a metallized film for a capacitor, the margin formation errors caused because of reliance on sensibility of the operator based on his or her experience can be eliminated and the poor adhesion between the films in the obtained capacitor can be overcome, to allow the production of a very good capacitor.

The auxiliary material may be an organic compound. The organic compound used is not too low in boiling point and is likely to be polymerized or crosslinked.

The auxiliary material may be an oil. Where the metal evaporated article is a metallized film for a capacitor, it is preferable to use a silicone oil or fluorine oil as the margin forming oil in view of electric properties. More preferable is a dimethyl polysiloxane, methyl phenyl silicone oil or perfluoropolyether, and further more preferable is methyl phenyl dimethyl polysiloxane oil or perfluoropolyoxyetane.

The auxiliary material may be water. It is preferable that the water is as pure as possible, containing few impurities.

An apparatus for producing a metal evaporated article, which is composed of (a) a metallization chamber, (b) a pressure reducing means for reducing the pressure in the metallization chamber, (c) substrate running means for running a substrate, (d) a metallization means and (e) an auxiliary material deposition means constituted by an evaporator for heating and evaporating an auxiliary material contained in it by a heating means, wherein in said metallization chamber, a metal is deposited by said metallization means onto the substrate run by said substrate running means, and before or after the metallization, the auxiliary material is deposited by said auxiliary material deposition means onto the substrate run by said substrate running means, comprising (f) a pressure detecting means for detecting the pressure in the atmosphere where the auxiliary material evaporated by said heating means of said evaporator exists, and (g) a temperature control means for controlling the heating temperature of said heating means based on the information concerning the detected pressure.

The evaporator has a heating means and contains an auxiliary material. The auxiliary material heated by the heating means is evaporated. The evaporated auxiliary material is discharged outside the evaporator from an opening of the evaporator. The discharged and evaporated auxiliary material is deposited onto the substrate.

The pressure of the atmosphere where the evaporated auxiliary material exists, i.e., the pressure reflecting the vapor pressure of the evaporated auxiliary material is detected by the pressure detecting means.

Based on the information concerning the detected pressure, the temperature of the heating means of the evaporator is controlled. This control keeps the deposition of the auxiliary material on the substrate substantially constant.

The detection end of the pressure detecting means may be placed in the atmosphere where the evaporated auxiliary material in the evaporator exists. A chamber pressure detecting means may be provided for detecting the pressure in the metallization chamber.

The metallization chamber may be kept in a reduced pressure atmosphere in the range of from about $1 \times 10$ Pa to about $1 \times 10^{-4}$ Pa, by the pressure reducing means for smooth metallization onto the substrate, and considering a case where the reduced pressure affects the detection of the pressure reflecting the vapor pressure of the auxiliary material, a chamber pressure detecting means for detecting the pressure in the metallization chamber is provided. With this, the influence of the pressure of the metallization chamber on the detection of the pressure of the atmosphere where the evaporated auxiliary material exists can be corrected.

A substrate speed detecting means for detecting the running speed of the substrate may be provided. A substrate speed detecting means for detecting the running speed of the substrate in the metallization chamber may be further provided. A case where the deposition quantity of the evaporated auxiliary material on the substrate varies depending on the running speed of the substrate is taken into account in this apparatus. This can solve the problem of relating the fluctuation in the running speed of the substrate to the variation in the quantity of the auxiliary material deposited on the substrate, while this adjustment can be little effected manually in reference to the sen sibility of the operator.

DESCRIPTION OF THE PREFERRED EMBODIMENTS

The present invention is described below in more detail based on an example in reference to the drawings, but is not limited to or thereby.

Figure 1:
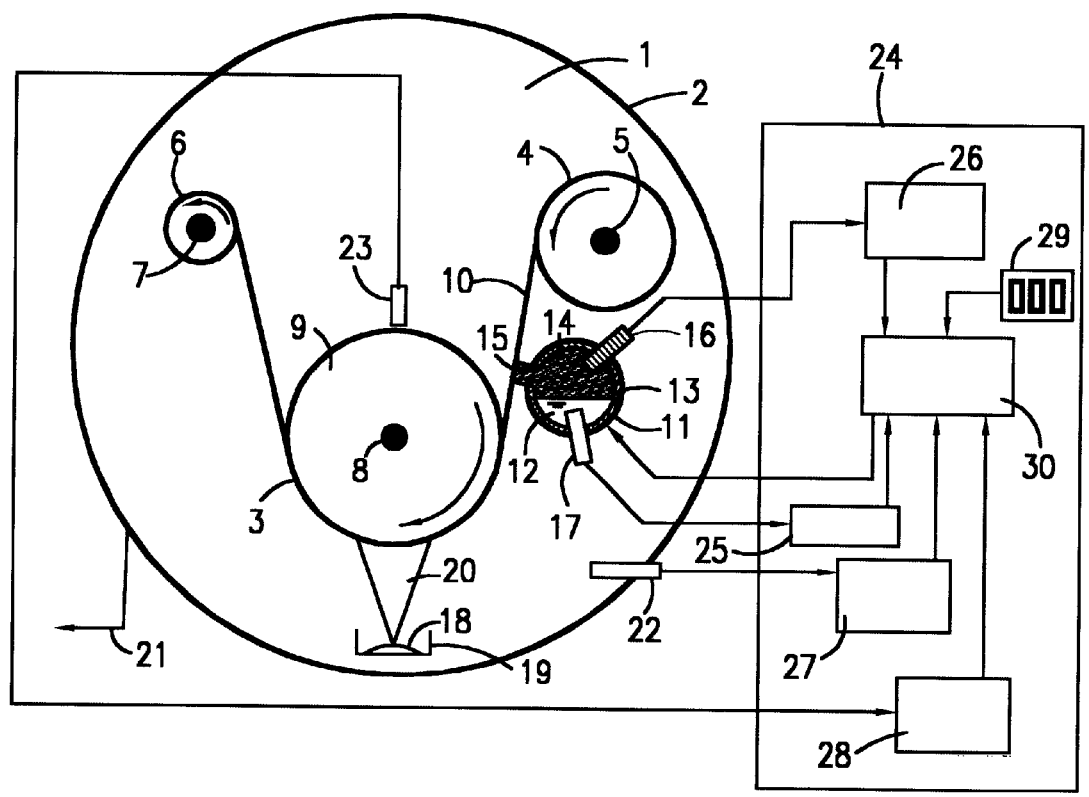
FIG. 1 is a typical sectional view partially showing an example of the apparatus for producing a metal evaporated article of the present invention.

FIG. 1 is a typical sectional view partially showing an example of the apparatus for producing a metal evaporated article of the present invention. This apparatus at first forms margins using an oil as an auxiliary material on a substrate formed by a continuous long synthetic resin film, and forms a deposited metal layer using a conductive metal, to produce a metallized film for a capacitor.

In FIG. 1, a metallization chamber 1 is a drum type housing 2 with a door. Substrate running means 3 include a shaft 5 on which a raw film roll is rotatably mounted, a shaft 7 on which a metal evaporated article (a metallized product) roll 6 is rotatably mounted and a cooling roll 9 placed between the two shafts 5, 7 and rotatably mounted on a shaft 8.

The shaft 7 has a rotation drive source (not illustrated) for positively driving the rotation of the shaft. The shaft 8 and/or the shaft 5 also has a rotation drive source (not illustrated) for positively driving the rotation of the shaft(s), or a braking means (not illustrated).

The substrate 10 unwound from the raw film roll 4 reaches the cooling roll 9 and runs in contact with part of the surface of the cooling roll 9, being wound as a metal evaporated article roll 6 by the rotation of the shaft 7.

Facing to the substrate 10 running between the raw film roll 4 and the cooling roll 9, an evaporator 11 containing an auxiliary material (oil) is installed. The evaporator 11 has a heating means 13 for heating and evaporating the auxiliary material (oil) 12. The auxiliary material (oil vapor) 14 heated and evaporated by the heating means 13 fills the upper space in the evaporator 11. The upper space communicates to an opening 15 of the evaporator 11, and the opening 15 faces the substrate 10, to allow the auxiliary material (oil vapor) 14 to be deposited on the surface of the substrate 10 in a desired width.

The evaporator 11 has a pressure detecting means 16 for detecting the pressure reflecting the vapor pressure of the evaporated auxiliary material (oil vapor) 14 and a temperature detecting means 17 for detecting the heating temperature of the auxiliary material (oil) 12.

In this example, the detection end of the temperature detecting means 17 is positioned in the auxiliary material (oil) 12 contained in the evaporator 11 and the detection end of the pressure detecting means 16 is positioned in the atmosphere where the evaporated auxiliary material (oil vapor) 14 in the evaporator 11 exists.

Furthermore, the metallization chamber 1 contains a metal 18 to be deposited by evaporation, and a heater 19 for evaporating the metal in molten state is installed. To promote the production of the metal vapor 20 by evaporating the molten metal 18 and the deposition of the metal onto the substrate 10, in this example, a pressure reducing means 21 for keeping the metallization chamber 1 under reduced pressure is connected with the metallization chamber 1.

The metallization chamber 1 is provided with a chamber pressure detecting means 22 for detecting the pressure in the metallization chamber 1 and a substrate speed detecting means 23 for detecting the surface speed of the cooling roll 9 substantially reflecting the running speed of the running substrate 10.

The control system in this example is described below. Outside the metallization chamber 1, a control system 24 is provided, and it is equipped with a thermometer 25, a first pressure gauge 26, a second pressure gauge 27, a speed meter 28, a set value entering means 29 and a controller 30.

The first pressure gauge 26 is electrically connected with the pressure detecting means 16 and the controller 30, so that it can receive and indicate the pressure information detected by the pressure detecting means 16, and transmit the information to the controller 30 (indicated by lines respectively with an arrow in the drawing).

The thermometer 25 is electrically connected with the temperature detecting means 17 and the controller 30, so that it can receive and indicate the temperature information detected by the temperature detecting means 17 and transmit the information to the controller 30 (indicated by lines respectively with an arrow in the drawing).

The second pressure gauge 27 is electrically connected with the chamber pressure detecting means 22 and the controller 30, so that it can receive and indicate the pressure information detected by the chamber pressure detecting means 22 and transmit the information to the controller 30 (indicated by lines respectively with an arrow in the drawing).

The speed meter 28 is electrically connected with the substrate speed detecting means 23 and the controller 30, so that it can receive and indicate the speed information detected by the substrate speed detecting means 23 and transmit the information to the controller 30 (indicated by lines respectively with an arrow in the drawing).

The set value entering means 29 is electrically connected with the controller 30, so that it can receive the set value for the pressure of the atmosphere where the evaporated auxiliary material (oil vapor) 14 exist, the set value for the heating temperature of the auxiliary material (oil) by the heating means 13 of the evaporator 11, the set value for the pressure in the metallization chamber 1 and the set value for the running speed of the substrate 10 respectively entered, and transmit the set value information to the controller 30 (indicated by lines respectively with an arrow in the drawing).

The controller 30 is electrically connected with the heating means 13, so that it can transmit the temperature control information to the heating means 13 (indicated by a line with an arrow in the drawing), for controlling the temperature.

The action of the apparatus in this example is described below.

The door of the drum type housing 2 forming the metallization chamber 1 is opened, and the raw film roll 4 of the substrate (synthetic resin film) (hereinafter called the film) 10 is set on the shaft 5. Then, the end of the film is unwound from the raw film roll 4, and guided around part of the peripheral surface of the cooling roll 9 rotatably installed on the shaft 8, then being fastened to the metal evaporated article roll 6 mounted on the shaft 7 driven to rotate. Thus, the setting of the film 10 in the substrate running means 3 is completed.

On the other hand, the auxiliary material (oil) is supplied into the evaporator 11 by a predetermined quantity, and the metal 18 is placed in the heater 19. Then, the door on a lateral side of the drum type housing 2 is closed. Furthermore, the respective set values are entered into the set value entering means 29, and they are transmitted to the controller 30. Thus, the pre-arrangement for operation of metallization is completed.

Subsequently, the heating means 13 of the evaporator 11 is actuated, to heat and evaporate the auxiliary material (oil) 12 contained in it, and the evaporated auxiliary material (oil vapor) 14 fills the space in the evaporator 14 and begins to be released toward the surface of the film 10. Concurrently, the pressure reducing means 21 is actuated, to lower the pressure in the metallization chamber 1 to vacuum, and the molten metal 18 contained in the heater 19 is evaporated. The evaporated metal vapor 20 begins to migrate toward the surface of the film 10.

As soon as or before or after the evaporated auxiliary material (oil vapor) 14 and the metal vapor 20 are produced, the film 10 begins to be run by the rotational drive of the shaft 7, and the auxiliary material (oil vapor) 14 is deposited onto the surface of the film 10, to form desired margins. Then, the metal vapor 20 is deposited onto the surface of the film 10 with the margins formed (the metal is not deposited on the margins), to form a desired metal layer. The film 10 with the metal layer formed is wound around the metal evaporated article roll 6. Thus a roll of a desired metal evaporated article (a metallized film for a capacitor) is produced.

In this duration, the pressure of the atmosphere where the auxiliary material (oil vapor) 14 exists, detected by the pressure detecting means 16 is indicated by the first pressure gauge 26 continuously or at certain time intervals, and compared with the set value in the controller 30. If any difference from the set value occurs, the control signal for adjusting the temperature of the heating means 13 to attain the set value is delivered from the controller 30 to the heating means 13. The heating condition of the heating means 13 for the auxiliary material (oil) 12 is adjusted, and as a result, the pressure of the atmosphere where the auxiliary material (oil vapor) 14 exists is kept at or near the set value. Thus, the formation of predetermined margins on the film is continued.

The temperature of the auxiliary material (oil) 12 is indicated by the thermometer 25 continuously or at certain time intervals, and is compared with the set value in the controller 30. As required, this information is referred to or used for adjusting the pressure of the atmosphere where the evaporated auxiliary material (oil vapor) 14 exists.

On the other hand, the margin formation may be affected by the pressure in the metallization chamber 1, and in this case, used is the information concerning the pressure in the metallization chamber 1 detected by the chamber pressure detecting means 22, indicated by the second pressure gauge 27 and applied to the controller 30.

It is preferable to find beforehand the coefficient of the influence of the pressure in the metallization chamber 1 on the pressure of the atmosphere where the evaporated auxiliary material (oil vapor) 14 exists, and to enter the coefficient into the controller 30 from the set value entering means 29, for utilizing the influence coefficient for temperature control of the heating means 13.

The margin formation may also be affected by the running speed of the film 10, and in this case, used is the information concerning the speed of the film 10 detected by the substrate speed detecting means 23, indicated by the speed meter 28 and entered into the controller 30. That is, it is preferable to find beforehand the coefficient of the influence of the film speed on the quantity of the evaporated auxiliary material (oil vapor) 14 deposited on the film 10, and to enter the coefficient into the controller 30 from the set value entering means 29, for utilizing the influence coefficient for temperature control of the heating means 13.

The opening 15 of the evaporator 11 can be many circular or rectangular holes formed in part of the surface of the evaporator 11 in the crosswise direction of the film running in opposite to the opening 15, or continuous slits formed in the crosswise direction of the film running in opposite, but is not limited to these forms.

The evaporator 11 can also be provided outside the metallization chamber 1, so that the evaporated oil obtained there may be introduced near the surface of the film 10 in the metallization chamber 1.

The heating means 13 of the evaporator 11 can be a planar heating element or tape heater provided outside the evaporator 11 or embedded in the evaporator 11 or provided inside the evaporator 11, or the evaporator 11 itself can also be a resistance heating element, though the heating means 13 is not limited to these examples. It is desirable that the heating element allows (Proportional Integral Derivative) PID control.

The temperature detecting means 17 may detect the temperature of the auxiliary material 12 or the temperature of the evaporator 11, and a suitable sensor of it is a thermocouple or resistance temperature sensor, though not limited to these examples.

The evaporator 11 can be of a type to contain a predetermined amount of the auxiliary material 12 in it or of an empty type to be supplied with the auxiliary material 12 from outside, but is not limited to these types.

The pressure detecting means 16 can be a diaphragm gauge or Pirani vacuum gauge, but is not limited to them. It is desirable that the pressure detecting means does not allow the auxiliary material (oil vapor) 14 to be condensed in the pressure gauge.

The controller 30 can be an ordinary programmable controller, and the set value entering means 29 can be an ordinary digital switch used for input of numerical values.

The chamber pressure detecting means 22 can be an ionization vacuum gauge, diaphragm gauge or Pirani vacuum gauge, but is not limited to them.

The substrate speed detecting means 23 can be of magnetic type or photoelectric type, but is not limited to them.

When the auxiliary material 12 is an organic compound, it is preferable to install a crosslinking device for polymerizing or crosslinking the organic compound, downstream of the evaporator 11.

The above description of the apparatus refers to a case where the metal 18 is deposited onto the substrate 10 after vapor deposition of the auxiliary material (oil) 12. However, when the order is reverse, the auxiliary material (oil) 12 can be deposited on the substrate after the metal 18 has been deposited. In this case, in the above apparatus, the installed positions of the evaporator 11 and the heater 19 in the running direction of the substrate 10 are reversed, or without reversing the installed positions, the substrate (film) 10 can be run in the reverse direction for metallization and oil deposition.

There is also a case where margins are formed on the substrate 10 at first, followed by the formation of a metal film and further by the formation of an oil film. In this case, in the above apparatus, another evaporator containing an oil similar to the evaporator 11 is installed between the cooling roll 9 and the metal evaporated article roll 6.

The other evaporator can be provided with a pressure detecting means and a temperature detecting means like the evaporator 11, and the information detected by them can be applied to the controller 30, to control the pressure of the atmosphere where the auxiliary material evaporated by the other evaporator exists.

The evaporator 11, the heater 19 and the other evaporator are not required to be one unit respectively, but can be formed by a plurality of units respectively.

Examples

Example 1 and Comparative Example 1

In Example 1, a 11 $\mu$m thick polyethylene terephthalate film with Zn deposited beforehand by evaporation, to have a resistance value of 6 $\Omega$/sq., a product width of 19 mm and a margin width of 2 mm was used as the substrate 11, and the evaporator 11 of the apparatus shown in FIG. 1 was used as the evaporator for depositing the oil onto the surface of the already formed metal layer, to test the performance of the evaporator 11. So, the heater 19 for depositing a metal was not used.

The raw film roll 4 of the substrate 10 was set on the shaft 5, and the substrate 10 was passed with a predetermined distance kept against the opening 15 of the evaporator 11, and guided around the cooling roll 9 in contact with it at a predetermined contact angle, being wound around the metal evaporated article roll 6, to complete setting in the metallization chamber 1. As the auxiliary material 12, phenyl methyl dimethyl polysiloxane (a silicone oil) was used.

A planar heating element was used as the heating means 13, a thermocouple as the temperature detecting means 17, a Pirani vacuum gauge as the pressure detecting means 16, and a magnetic tachometer as the speed detecting means 23.

The heating means 13 was set and automatically controlled to keep the pressure in the evaporator 11 at 60 Pa.

In Comparative Example 1, the conventional method was used, in which the temperature of the heating means was manually raised gradually after every certain metallization length.

From the metallized (zinc deposited) films obtained in Example 1 and Comparative Example 1, the margin portions (2 mm wide) were cut off, and the obtained 19 mm wide metallized films (metal evaporated articles) were cut in the initial metallization portion, central portion and final metallization portion, to obtain five 25 cm long samples in each portion. For a moisture resistance test, the samples were placed in a thermo-hygrostat (Type PR-2G produced by Tabai K.K.) and allowed to stand at 85° C. and 85% RH for 3 hours. Of the 15 samples, the electric resistance of each film was measured before and after test by an ohm meter (OHM METER produced by Toyo Metallizing K.K.). The measured results are shown in Table 1.

TABLE 1

|  | Resistance of film before test ($\Omega/\square$) value | Resistance of film after test ($\Omega/\square$) | | Film resistance change rate (%) | |
| --- | --- | --- | --- | --- | --- |
|  |  | Mean value | Range | Mean value | Range |
| Example 1 | 6.0 | 6.6 | 6.5–6.8 | 10.5 | 8.2–11.9 |
| Comparative Example 1 | 6.0 | 7.2 | 6.7–7.7 | 19.8 | 11.7–25.4 |

Two sheets of each metallized film were overlaid and wound, and pressed at 120° C. at a pressure of 5.9×10⁶ N/m², to prepare ten 0.3 μF elements. Each element was loaded, and the load at which the wound element was disfigured was identified as the press workability (kg). A larger load means better press workability. The results are shown in Table 2. The samples of Example 1 showed good press workability stably.

TABLE 2

|  | Press workability (kg) | |
| --- | --- | --- |
|  | Mean value | Range |
| Example 1 | 6.2 | 5.2–6.8 |
| Comparative Example 1 | 5.4 | 4.2–6.7 |

Figure 2:
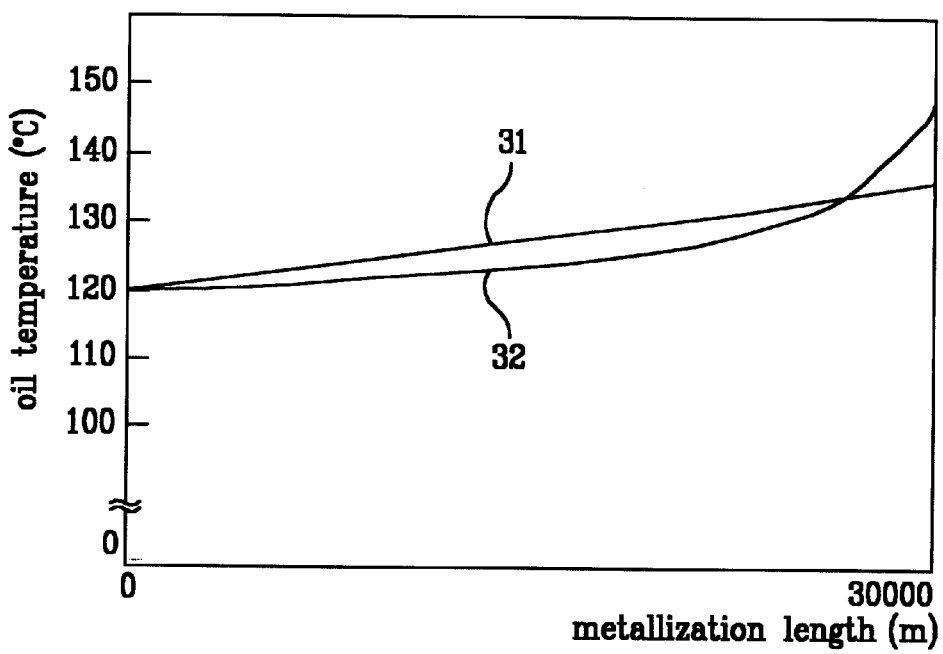
FIG. 2 is a graph for explaining the relations between metallization length and oil temperature in an example of the present invention and a comparative example.

FIG. 2 is a graph showing the changes of oil temperature for metallization in Example 1 and Comparative Example 1. The metallization length (m) is chosen as the abscissa, and the oil temperature (° C.) for the corresponding metallization length, as the ordinate.

The line 31 showing the oil temperature changes during production according to the conventional method (Comparative Example 1) shows that the operator raised the oil temperature at a constant rate after every certain evaporation length.

On the contrary, in the process and apparatus for producing a metal evaporated article of the present invention (Example 1), since the pressure of the atmosphere where the evaporated auxiliary material existed could be automatically kept at a predetermined value, the oil temperature slowly increased in the beginning of metallization as shown by line 32, and in the latter half of metallization, the oil temperature became higher quickly, to keep the pressure formed by the oil vapor almost constant.

The reason is that in the beginning of metallization, since the low molecular components of oil were evaporated actively, it was not necessary to raise the oil temperature so much, but that in the latter half of metallization, since much higher molecular components unlikely to be evaporated remained, the temperature had to be raised for positive evaporation.

Furthermore, in Example 1, since the internal pressure of the metallization chamber 1 was kept continuously at a reduced pressure (vacuum side) by the pressure reducing means 21, the vacuum degree gradually increased in the latter half of metallization. However, also in this case, since the vacuum degree in the metallization chamber 1 was detected by the chamber pressure detecting means 22, the controller 30 corrected the set value of 60 Pa for the pressure formed by oil vapor, and so the thickness of the deposited oil layer formed in the beginning of steady operation was kept also thereafter. Also when the metallization speed was changed as required, the controller 30 automatically corrected the set value for the pressure of the atmosphere where the oil vapor existed, and so the optimum thickness of the deposited layer was kept in the series of metal evaporated article process.

What is claimed is:

1. A process for producing a metal evaporated article, which includes a metallization step of evaporating a metal and depositing the evaporated metal onto a continuously running substrate and an auxiliary material deposition step of evaporating an auxiliary material contained in an evaporator and depositing the evaporated auxiliary material onto the continuously running substrate, before or after the metallization step, comprising controlling the rate of evaporation of the auxiliary material in the evaporator and deposition of said auxiliary material on said continuously running substrate by the steps of continually detecting the pressure of the atmosphere where the auxiliary material evaporated from the evaporator exists, and continually varying the heating temperature of the auxiliary material in response to detected said pressure.

2. A process for producing a metal evaporated article, according to claim 1, wherein the auxiliary material is an organic compound.

3. A process for producing a metal evaporated article, according to claim 1, wherein the auxiliary material is an oil.

4. A process for producing a metal evaporated article, according to claim 1, wherein the auxiliary material is water.

5. A process for producing a metal evaporated article comprising:
   evaporating an auxiliary material contained in an evaporator and depositing evaporated auxiliary material onto a continuously running substrate while detecting the pressure of the atmosphere where the auxiliary material evaporated from the evaporator exists;
   controlling the rate of evaporation of the auxiliary material in the evaporator based on detected pressure; and
   evaporating a metal and depositing the evaporated metal onto the continuously running substrate having auxiliary material deposited thereon.

6. The process for producing a metal evaporated article according to claim 5, wherein the rate of evaporation of the auxiliary material in the evaporator is controlled by varying the heating temperature of the auxiliary material in response to the detected pressure.

7. A process for producing a metal evaporated article comprising:

evaporating a metal and depositing the evaporated metal onto a continuously running substrate in a chamber;

evaporating an auxiliary material contained in an evaporator in the chamber and depositing the evaporated auxiliary material onto the continuously running substrate having metal deposited thereon; and detecting the pressure of the atmosphere where the auxiliary material evaporated from the evaporator exists and controlling the rate of evaporation of the auxiliary material in the evaporator based on detected pressure.

8. A process for producing a metal evaporated article comprising:

evaporating an auxiliary material contained in an evaporator and depositing evaporated auxiliary material onto a continuously running substrate while continually detecting the pressure of the auxiliary material evaporated from the evaporator;

controlling the rate of evaporation of the auxiliary material in the evaporator based on said detected pressure by continually varying the heating temperature of the auxiliary material; and evaporating a metal and depositing the evaporated metal onto the continuously running substrate having auxiliary material deposited thereon.

9. The process for producing a metal evaporated article according to claim 8, wherein the rate of evaporation of the auxiliary material in the evaporator is controlled by varying the heating temperature of the auxiliary material in response to the detected pressure.

10. A process for producing a metal evaporated article comprising:

evaporating a metal and depositing the evaporated metal onto a continuously running substrate in a chamber;

evaporating an auxiliary material contained in an evaporator in the chamber and depositing the evaporated auxiliary material onto the continuously running substrate having metal deposited thereon; and continually detecting the pressure of the auxiliary material evaporated from the evaporator and controlling the rate of evaporation of the auxiliary material in the evaporator based on detected pressure by continually varying the heating temperature of the auxiliary material.

* * * * *

UNITED STATES PATENT AND TRADEMARK OFFICE
CERTIFICATE OF CORRECTION

PATENT NO. : 6,428,848 B1
DATED : August 6, 2002
INVENTOR(S) : Hatada et al.

It is certified that error appears in the above-identified patent and that said Letters Patent is hereby corrected as shown below:

Column 4,
Line 38, please change "sen sibility" to -- sensibility --.

Column 7,
Line 61, please change "(Proportional Integral Derivative) PID" to
-- PID (Proportional Integral Derivative) --.

Signed and Sealed this

Fourth Day of February, 2003

JAMES E. ROGAN
*Director of the United States Patent and Trademark Office*